(12) United States Patent
Redder et al.

(10) Patent No.: US 11,275,134 B2
(45) Date of Patent: Mar. 15, 2022

(54) METHOD AND APPARATUS FOR IMPROVING DATA COMMUNICATIONS LINK EFFICIENCY AND ROBUSTNESS IN A MAGNETIC RESONANCE IMAGING (MRI) SYSTEM

(71) Applicant: KONINKLIJKE PHILIPS N.V., Eindhoven (NL)

(72) Inventors: Paul Franz Redder, Newberry, FL (US); Arne Reykowski, Newberry, FL (US); Filips Van Liere, Best (NL)

(73) Assignee: Koninklijke Philips N.V., Eindhoven (NL)

( * ) Notice: Subject to any disclaimer, the term of this patent is extended or adjusted under 35 U.S.C. 154(b) by 310 days.

(21) Appl. No.: 16/335,860

(22) PCT Filed: Sep. 29, 2017

(86) PCT No.: PCT/EP2017/074790
§ 371 (c)(1),
(2) Date: Mar. 22, 2019

(87) PCT Pub. No.: WO2018/060432
PCT Pub. Date: Apr. 5, 2018

(65) Prior Publication Data
US 2019/0212402 A1 Jul. 11, 2019

Related U.S. Application Data

(60) Provisional application No. 62/401,352, filed on Sep. 29, 2016.

(51) Int. Cl.
*G01R 33/36* (2006.01)
*H03M 13/35* (2006.01)
*G01R 33/48* (2006.01)

(52) U.S. Cl.
CPC ..... *G01R 33/3621* (2013.01); *G01R 33/3692* (2013.01); *G01R 33/4818* (2013.01); *H03M 13/356* (2013.01)

(58) Field of Classification Search
CPC ............ G01R 33/3621; G01R 33/3692; G01R 33/4818; H03M 13/356
See application file for complete search history.

(56) References Cited

U.S. PATENT DOCUMENTS 5,451,876 A 9/1995 Sandford et al.
7,688,068 B2 3/2010 Beatty
(Continued)

FOREIGN PATENT DOCUMENTS

DE 102011006578 A1 10/2012

OTHER PUBLICATIONS

"Coding Theory" Downloaded From Wikipedia Mar. 18, 2019.
(Continued)

*Primary Examiner* — Son T Le
*Assistant Examiner* — Adam S Clarke

(57) ABSTRACT

In MRI system, acquired MR signals that will have a greater impact on the quality of the final reconstructed MRI image if a data link error occurs are encoded with a higher, or more robust, level of encoding prior to being transmitted over a data communications link. Conversely, acquired MR signals that will have a lesser impact on the quality of the final reconstructed MRI image if a data link error occurs are encoded with a lower, or less robust, level of encoding prior to being transmitted over the data communications link. The overall result is improved data link robustness and efficiency for data being sent over the data link.

22 Claims, 8 Drawing Sheets

(56) References Cited

U.S. PATENT DOCUMENTS

| | | |
|---|---|---|
| 7,990,145 B2 | 8/2011 | Boef et al. |
| 8,548,560 B2 | 10/2013 | Saes et al. |
| 8,575,935 B2 | 11/2013 | Roeven et al. |
| 9,519,038 B2 | 12/2016 | Okamoto et al. |
| 2010/0021032 A1 | 1/2010 | Boef et al. |
| 2013/0057278 A1 | 3/2013 | Schmidt |
| 2014/0070804 A1 | 3/2014 | Huang et al. |
| 2017/0053402 A1* | 2/2017 | Migukin ............... G06T 7/0012 |
| 2018/0164395 A1* | 6/2018 | Setsompop ........ G01R 33/5613 |

OTHER PUBLICATIONS

Shashi Borade et al "Unequal Error Protection: An Information-Theoretic Perspective" IEEE Transactions on Information Theory, vol. 55, No. 12, Nov. 20, 2009, p. 5511-5539.

* cited by examiner

METHOD AND APPARATUS FOR IMPROVING DATA COMMUNICATIONS LINK EFFICIENCY AND ROBUSTNESS IN A MAGNETIC RESONANCE IMAGING (MRI) SYSTEM

CROSS REFERENCE TO RELATED APPLICATIONS

This application is a U.S. national phase application of International Application No. PCT/EP2017/074790, filed on Sep. 29, 2017, which claims the benefit of U.S. provisional Application Ser. No. 62/401,352 filed on Sep. 29, 2016 and is incorporated herein by reference.

BACKGROUND

MRI is an imaging technology that allows cross-sectional viewing of objects, such as those found in a human body, with unprecedented tissue contrast. MRI is based on the principles of nuclear magnetic resonance (NMR), namely, that atomic nuclei with non-zero spin have a magnetic moment. In medical imaging, it is usually the nuclei of hydrogen atoms, which are present in the human body in high concentrations. Radio frequency (RF) waves are directed at the nuclei in strong external magnetic fields, leading to an excitation of the protons and a relaxing of the protons. Relaxation of the protons, results in RF signals being emitted by the nuclei that can be detected and processed to form an image.

RF receive coils of the MRI system detect the RF signals emitted by the nuclei. The RF receive coils are located on or very near the human body being scanned. An RF receiver that is typically located at or very near the RF coil receives the RF signals detected by the RF coils and converts the received RF signals into analog electrical signals. The RF receiver typically includes an analog-to-digital converter (ADC) that samples the analog electrical signal and converts it into digital samples. The digital samples are then encoded (i.e., data compression and error correction encoding), converted from the electrical domain to the optical domain and transmitted over an optical fiber data communications link to remote equipment located in a technical room that is physically separate from the examination room in which the patient is located. The remote equipment converts the information transmitted over the link from the optical domain to the electrical domain and decodes the information (i.e., reverses the encoding process) to recover the image data. A reconstruction computer of the remote equipment performs a reconstruction algorithm that processes the image data to reconstruct the image. U.S. Pat. No. 8,575,935 (hereinafter "the '935 patent), which is hereby incorporated by reference herein in its entirety, discloses such an arrangement.

In some MRI systems, the digitization of the RF signal is performed by an ADC of the remote equipment rather than by an ADC of the RF receiver. For example, rather than having an optical fiber data communications link, in some cases the data communications link is a coaxial cable over which the RF signals are communicated from the RF receiver to the remote equipment. In a network hub of the remote equipment, an ADC samples the RF signal to perform digitization. A reconstruction computer of the remote equipment performs a reconstruction algorithm that processes the image data to reconstruct the image. The '935 patent also discloses this alternative arrangement.

Modern MRI systems use multiple RF coils to obtain high resolution images of the human body. In such systems, the data rates needed to support high resolution imaging can exceed 1 gigabit per second (Gbps). Compression and error correction encoding techniques are used to encode data prior to transmitting it over an optical fiber communications link in order to reduce the data payload and improve the robustness of the link. The current approach to encoding used in modern MRI systems applies one fixed level of encoding for control data and another fixed level of encoding for image data. For control data, which has a lower data rate requirement, a higher level of encoding is applied, resulting in a robust data link that it has a low bit error rate (BER). However, the higher level of encoding results in lower data link efficiency due to the larger number of bits used to encode the data. For image data, which has a high data rate requirement, a lower level of encoding is applied, resulting in a more efficient data link due to the smaller number of bits used to encode the data, but one that is also less robust (i.e., a higher BER). Thus, with the current approach, there is a tradeoff between link efficiency and link robustness.

It would be desirable to provide a method and apparatus for encoding data in an MRI system in a way that simultaneously improves data link efficiency and data link robustness, thereby eliminating the tradeoff.

BRIEF DESCRIPTION OF THE DRAWINGS

The representative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
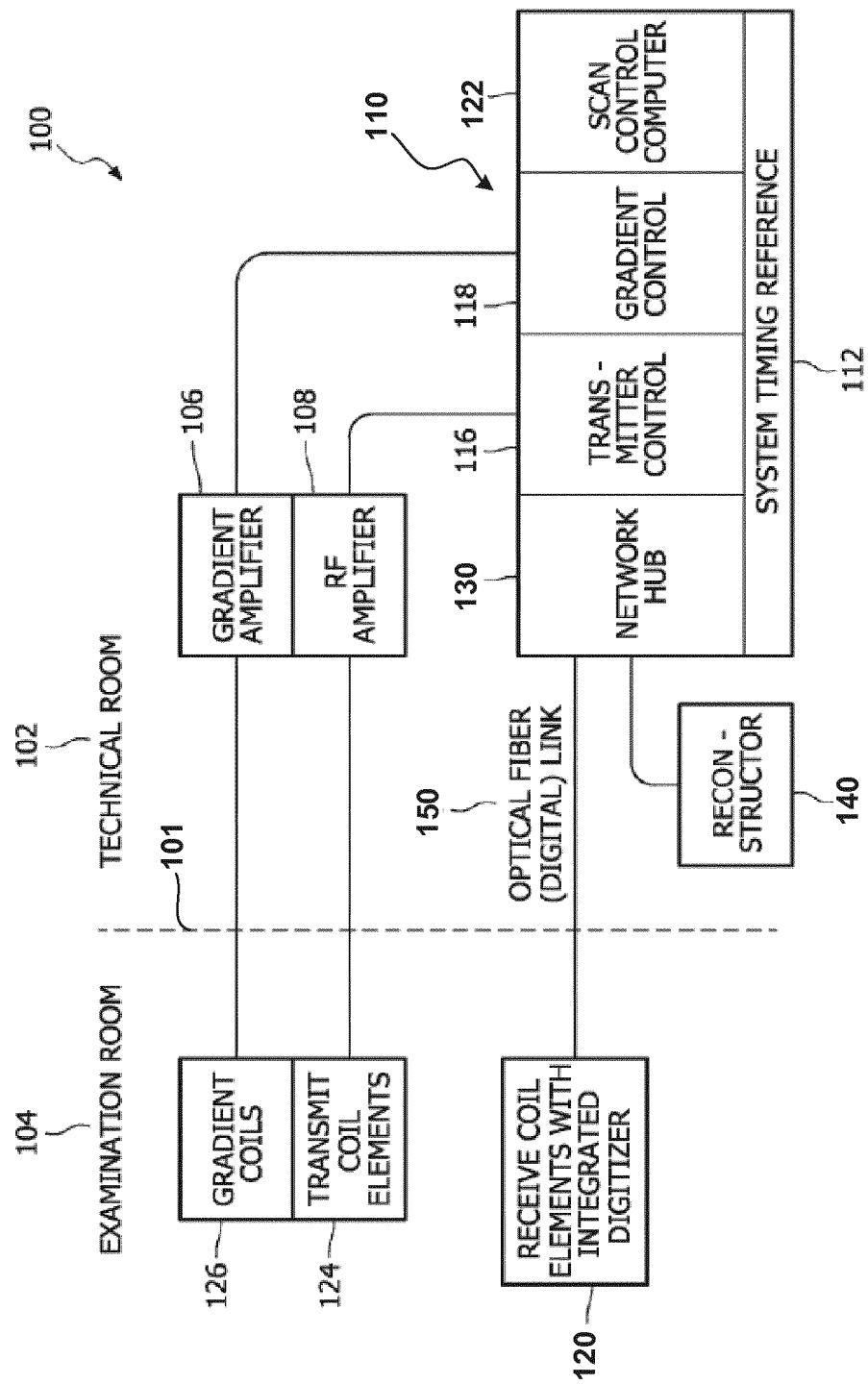
FIG. 1 illustrates a block diagram of electrical, electromagnetic, magnetic and optical components of an MRI system 100 in accordance with a representative embodiment.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

It is to be understood that the terminology used herein is for purposes of describing particular embodiments only, and is not intended to be limiting. Any defined terms are in addition to the technical and scientific meanings of the defined terms as commonly understood and accepted in the technical field of the present teachings.

As used in the specification and appended claims, the terms "a", "an" and "the" include both singular and plural referents, unless the context clearly dictates otherwise. Thus, for example, "a device" includes one device and plural devices.

As used in the specification and appended claims, and in addition to their ordinary meanings, the terms "substantial" or "substantially" mean to with acceptable limits or degree. For example, "substantially cancelled" means that one skilled in the art would consider the cancellation to be acceptable.

As used in the specification and the appended claims and in addition to its ordinary meaning, the term "approximately" means to within an acceptable limit or amount to one having ordinary skill in the art. For example, "approximately the same" means that one of ordinary skill in the art would consider the items being compared to be the same.

MR signals acquired during an MRI scan vary in terms of the impact that they can have on the final reconstructed MRI image. Some MR signals can have a greater impact on the final reconstructed MRI image if a link error occurs during transmission of the corresponding information over the optical fiber data communications link. Other MR signals have a lesser impact on the final reconstructed MRI image if a link error occurs during transmission of the corresponding information over the optical fiber data communications link. In accordance with representative embodiments described herein, acquired MR signals that will have a greater impact on the quality of the final reconstructed MRI image if a data communications link error occurs are encoded with a higher, or more robust, level of encoding prior to being transmitted over the optical fiber data communications link. Conversely, acquired MR signals that will have a lesser impact on the quality of the final reconstructed MRI image if a data communications link error occurs are encoded with a lower, or less robust, level of encoding prior to being transmitted over the optical fiber data communications link. The overall result is improved data link robustness and efficiency for data being sent over the data link. A few illustrative, or representative, embodiments of a method and an apparatus for encoding image data will now be described with reference to the figures, in which like reference numerals represent like elements, features or components.

The term "level of encoding," as that term is used herein, relates to the number of bits that is utilized to encode data to be transmitted over a communications link. A variety of encoding techniques may be used to encode data to be transmitted over a communications link. For example, it is well known to encode data with a number of parity or checksum bits to provide redundancy that the receiver on the opposite end of the communications link can use to check the accuracy of the received message. It is also known to transmit the same data bits multiple times to increase the likelihood that the receiver on the opposite end of the link properly receives the message. In general, these known encoding techniques, or combinations thereof, increase the number of bits being transmitted over the communications link to a number that exceeds the number of data bits. The terms "higher level of encoding" or "more robust level of encoding," as those terms are used herein, refer to the use of a larger rather than smaller number of bits to encode the data. Conversely, the terms "lower level of encoding" or "less robust level of encoding," as those terms are used herein, refer to the use of a smaller rather than larger number of bits to encode the data. Thus, a higher, more robust, level of encoding uses a larger number of encoding bits (e.g., parity bits) than the number of encoding bits used by a lower, less robust, level of encoding.

In addition to the number of encoding bits that are used, other encoding techniques that increase or decrease the encoding robustness in other ways can be used to further increase or decrease, respectively, encoding robustness.

Thus, if a higher or more robust level of encoding is used to encode data to be transmitted over a communications link, an unrecoverable communications link error is less likely to occur during the transmission of the data over the communications link. Conversely, if a lower or less robust level of encoding is used to encode data to be transmitted over a communications link, an unrecoverable link error is more likely to occur during the transmission of the data over the communications link.

FIG. 1 illustrates a block diagram of electrical, electromagnetic, magnetic and optical components of an MRI system 100 in accordance with a representative embodiment. A dashed line 101 is used to indicate a separation of components of the MRI system 100 into components that are located in a technical room 102 and components that are located in an examination room 104, although the disclosure is not limited with respect to locations at which components of the system 100 are located. The reason for the separation is that, in the examination room 104, the MRI magnet is located together with its gradient coils 126, its transmit coil elements 124 and receive coil elements with integrated digitizer 120. For excitation of nuclei for MR imaging purposes, high frequency RF pulses are applied via the transmit coil elements 124 and the RF signals emitted by the nuclei are detected by the receive coil elements with integrated digitizer 120. The shielding of the examination room 104 ensures high quality detection of the RF signals by the receive coil elements with integrated digitizer 120 without strong disturbances.

A gradient amplifier 106 and an RF amplifier 108 are located in the technical room 102 and increase the amplitude of signals provided to the gradient coils 126 and to the transmit coil elements 124, respectively, for performing MRI scans. A control and data acquisition system 110 located in the technical room 102 controls the operations of the MRI system 100. The control and data acquisition system 110 includes a transmitter control unit 116, a gradient control unit 118, a system timing reference 112, a scan control computer 122, and a network hub 130. The scan control computer 122 controls the operations of the transmitter control unit 116 and of the gradient control unit 118, which, in turn, control the operations of the RF amplifier 108 and the gradient amplifier 106, respectively, to perform MRI scans. A reconstruction unit 140 located in the technical room 102 and interfaced with the control and data acquisition system 110 performs image reconstruction on image data received in the network hub 130.

The receive coil elements with integrated digitizer 120 is connected via an optical fiber data communications link 150 to the network hub 130. As will be described below in more detail, in accordance with a representative embodiment, the receive coil elements with integrated digitizer 120 includes at least one RF receiver, at least one optical transmitter, at least one analog-to-digital converter (ADC) and at least one processor. The RF receiver receives RF signals detected by the receive coil elements and the ADC converts the received RF signals into digital signals. The processor selects a level of encoding to be used to encode the digital signals based on one or more characteristics of the digital signals and encodes the digital signals with the selected level of encoding. The optical transmitter converts the encoded digital signals into optical data signals and transmits the optical data signals over the optical fiber data communications link 150 to the network hub 130.

In the network hub 130, the optical data signals are converted into electrical data signals. At least one processor of the network hub 130 decodes the electrical data signals to reverse the encoding process performed in the receive coil elements with integrated digitizer 120. The decoded electrical data signals are provided to the reconstruction unit 140, which reconstructs the MRI image obtained by the MRI scan.

The system timing reference 112 generates a master clock signal that is provided to the components 116, 118, 122 and 130 of the control and data acquisition system 110 for controlling the timing of operations performed by those components. The master clock signal is delivered to the receive coil elements with integrated digitizer 120 in a data stream carried over the link 150. The receive coil elements with integrated digitizer 120 has a phase locked loop (PLL) that locks to the master clock signal in order to recover the master clock signal. The recovered master clock signal or a clock signal of a different frequency that is derived from the recovered master clock signal is used by the ADC of the receive coil elements with integrated digitizer 120 to sample the RF signals received by the RF receiver of the receive coil elements with integrated digitizer 120. Representative embodiments of various configurations of the receive coil elements with integrated digitizer 120 for recovering the master clock signal and using the master clock signal, or a clock signal derived from the master clock signal, to sample the RF signals are disclosed in the '953 patent and described with reference to FIGS. 2-7 of the '953 patent. Therefore, in the interest of brevity, a detailed discussion of the circuitry used in the receive coil elements with integrated digitizer 120 to recover the master clock signal is not provided herein.

Figure 2:
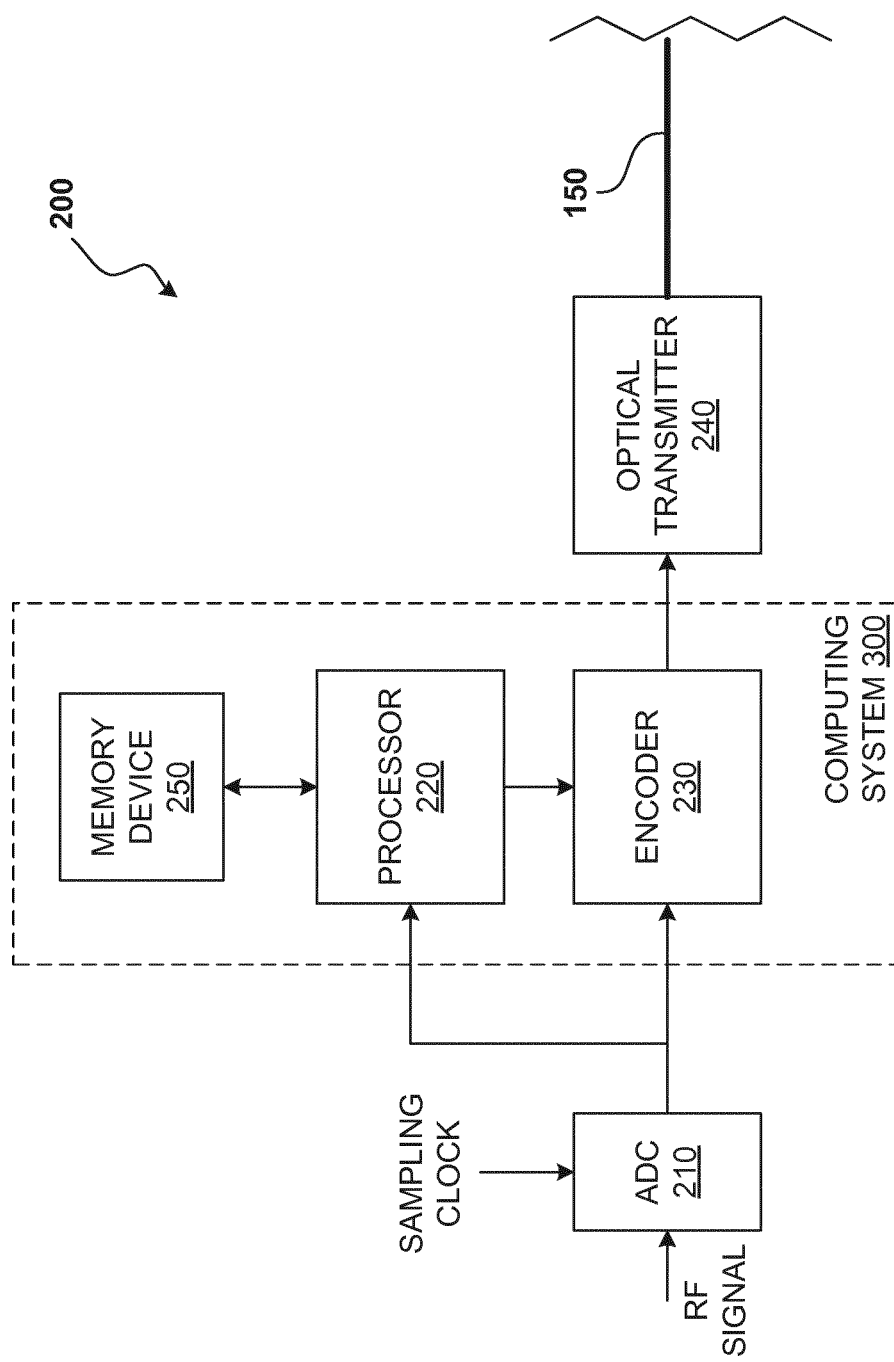
FIG. 2 illustrates a block diagram of a sampling and encoding circuit of the receive coil elements with integrated digitizer shown in FIG. 1 in accordance with a representative embodiment.

FIG. 2 illustrates a block diagram of a sampling and encoding circuit 200 of the receive coil elements with integrated digitizer 120 shown in FIG. 1 that samples the RF signals to convert them into digital samples, assigns a level of encoding to be applied to the digital samples based on at least one signal characteristic associated with the samples, encodes the samples with the assigned encoding level, converts the encoded samples into optical data signals, and transmits the optical data signals over the optical fiber data communications link 150 to the network hub 130 of the control and data acquisition system 110. As will be described below in more detail with reference to the flow diagrams of FIGS. 3-7, the signal characteristic(s) that is used to determine the level of encoding to be applied may include, for example, one or more of a signal-to-noise ratio (SNR) associated with one or more of the samples, the amplitude of one or more of the samples, or any other signal characteristic or parameter that is indicative of the impact that the corresponding samples will have on the final reconstructed image if a link error occurs during the transmission of the samples from the receive coil elements with integrated digitizer 120 over the optical fiber data communications link 150 to the network hub 130. For example, a relatively large SNR associated with one or more of the samples can be an indication that a loss of the samples due to a link error occurring during the transmission of the samples over the optical fiber data communications link 150 will have a great impact on the final reconstructed.

In accordance with this embodiment, the sampling and encoding circuit 200 includes at least one ADC 210, at least one processor 220, at least one encoder 230, at least one optical transmitter 240, and at least one memory device 250. In other representative embodiments, the sampling and encoding circuit 200 includes P ADCs 210, where P is a positive integer that is greater than or equal to one, at least one processor 220, at least one encoder 230, M optical transmitters 240, where M is a positive integer that is greater than or equal to one, and at least one memory device 250. P and M may be, but need not be, equal to one another. The memory device 250 stores computer code, or instructions, that are executed by the processor 220. The memory device 250 may also store digital samples output from the ADC 210. The ADC 210, which comprises the integrated digitizer of the receive coil elements with integrated digitizer 120, uses a sampling clock signal to sample the RF signals received by the receive coil elements with integrated digitizer 120. The RF signals acquired by the RF receiver and sampled by the ADC 210 are typically referred to as MR signals, and therefore will be referred to as such hereinafter. The sampling clock signal is derived from the recovered master clock signal that is generated by the system timing reference 112 and transmitted over the link 150 to the receive coil elements with integrated digitizer 120. The ADC 210 outputs digital MR signal samples to the processor 220 and to the encoder 230.

In MRI systems, digitized MR signal samples are typically transformed from the time domain to the frequency domain using a fast Fourier transform (FFT) process. The transformed signal samples comprise an image that is typically represented in a coordinate space called k-space. A k-space representation is typically displayed as a rectangular grid with principle axes $k_x$ and $k_y$. The $k_x$ axis and the $k_y$ axis correspond to the horizontal (x) axis and the vertical (y) axis, respectively, of the k-space representation. These axes represent spatial frequencies in the x- and y-directions. Each point in k-space defined by a ($k_x$, $k_y$) coordinate pair contains spatial frequency and phase information about every pixel in the final reconstructed image. Conversely, each pixel in the final reconstructed image maps to every point in k-space. The k-space values of the matrix are normally referred to as raw data by those skilled in the art of MRI technology.

The degree to which image content of a final reconstructed MRI image is affected by a point in k-space is proportional to the amplitude of the MR signal corresponding to that point in k-space. Points near the center of k-space have a low-frequency influence on the final reconstructed MRI image and points near the periphery of k-space have a high-frequency influence on the final reconstructed MRI image. The center of k-space is a value that represents the sum of all of the MR signals. Due to the nature of images that are produced in MRI systems, MR signals corresponding to points near the center of k-space are much larger in amplitude than MR signals corresponding to points near the periphery of k-space. Consequently, if a link error occurs with respect to an MR signal corresponding to a point near the center of k-space, the entire image can be affected to a large extent. On the other hand, if a link error occurs with respect to an MR signal corresponding to a point near the periphery of k-space, only a marginal amount of image resolution is lost, and therefore the entire image is not affected to a large extent.

For these reasons, in accordance with a representative embodiment, a higher, or more robust, level of encoding is applied to k-space points nearer the center of k-space and a lower, or less robust, level of encoding is applied to k-space points that are farther from the center of k-space. In accordance with this representative embodiment, the processor 220 is configured, or programmed, to perform an FFT process on digital samples output from the ADC 210 during an MRI scan to create a k-space representation of the MRI image. The k-space representation is a matrix of values that is stored in the memory device 250. The processor 220 is also configured, or programmed, to assign a level of encoding to be performed on the values of the k-space matrix based on where in k-space the points corresponding to those values are located. Because the ($k_y$, $k_x$) coordinate pairs of the points are known to the processor 220, the processor 220 can easily decide whether k-space matrix values are associated with a point that is in a central region of k-space or is outside of the central region. In accordance with a representative embodiment, the k-space coordinates that define the boundaries of the central region of k-space are predefined so that the processor 220 can easily determine the level of encoding to be applied based on the corresponding k-space coordinates.

To perform the encoding process in the encoder 230, the processor 220 assigns a level of encoding to be performed on k-space matrix values read out of the memory device 250 by the processor 220 and causes the encoder 230 to encode the k-space matrix values with the assigned level of encoding. In accordance with a representative embodiment, the processor 220 assigns a first, higher, or more robust, level of encoding for k-space matrix values corresponding to points in k-space that are in the central region of k-space and assigns a second, lower, less robust, level of encoding for k-space matrix values corresponding to points in k-space that are outside of the central region of k-space. The encoder is configured to apply either the first, higher, or more robust, level of encoding and to apply a second, lower, less robust, level of encoding in accordance with encoding levels assigned by the processor 220.

The encoded values output from the encoder 230 are input to the optical transmitter 240. The optical transmitter 240 includes an electrical-to-optical converter (EOC) device (not shown), such as a laser diode or a light emitting diode (LED), and an EOC driver (not shown). The EOC driver receives the encoded values output from the encoder 230 and drives the EOC device in accordance with the encoded values to generate an optical data signal that is coupled into the end of the optical fiber data communications link 150 and transmitted over the link 150 to the network hub 130 connected to the opposite end of the link 150. The network hub 130 includes an optical-to-electrical converter (OEC) device (not shown), such as a p-type-intrinsic-n-type (PIN) diode, that converts the optical data signals into electrical data signals. The network hub 130 includes one or more processors that decode the electrical data signals and then perform an inverse Fourier Transform (FT) operation on the decoded data signals to return the data signals to the k-space values that were originally stored in the memory device 250 as raw data. The reconstruction unit 140 receives the raw data from the network hub 130 and performs a known reconstruction process that processes the raw data to produce the final reconstructed MRI image.

It should be noted that although the sampling and encoding circuit 200 shown in FIG. 2 that performs the digitization, transformation and encoding processes has been described above as being co-located with the RF coil elements with integrated digitizer 120, this is not a requirement. The sampling and encoding circuit 200 is located on the opposite end of the link 150 from the network hub 130, but it is not necessary for it to be part of component 120, although the sampling and encoding circuit 200 is electrically coupled in some way to component 120 in order to process the RF signals acquired by component 120.

The combination of the processor 220, the encoder 230 and the memory device 250 comprises a computing system 300 on which encoding methods in accordance with representative embodiments described herein can be implemented. The computing system 300 can include a set of instructions that can be executed to cause the computing system 300 to perform any one or more of the methods or computer-based functions disclosed herein. The computing system 300 may operate as a standalone device or may be connected via a wired, wireless and/or optical network to other computing systems or peripheral devices.

In a networked deployment, the computing system 300 may operate in the capacity of a server or as a client user computer in a server-client user network environment, or as a peer computing system in a peer-to-peer (or distributed) network environment. The computing system 300 can also be implemented as or incorporated into various devices, such as a stationary computer, a mobile computer, a personal computer (PC), a laptop computer, a tablet computer, a wireless smart phone, a set-top box (STB), a personal digital assistant (PDA), a global positioning satellite (GPS) device, a communications device, a control system, a camera, a web appliance, a network router, switch or bridge, or any other machine capable of executing a set of instructions (sequential or otherwise) that specify actions to be taken by that machine. The computing system 300 can be incorporated as or in a particular device that in turn is in an integrated system that includes additional devices. The computing system 300 can be implemented using electronic devices that provide, for example, voice, video or data communication. Further, while a single computing system 300 is illustrated, the term "system" shall also be taken to include any collection of systems or sub-systems that individually or jointly execute a set, or multiple sets, of instructions to perform one or more computer functions.

The processor 220 and the memory device 250 of the computing system 300 are both tangible, non-transitory, devices. As used herein, the term "non-transitory" is to be interpreted not as an eternal characteristic of a state, but as a characteristic of a state that will last for a period of time, and specifically disavows fleeting characteristics such as characteristics of a particular carrier wave or signal or other forms that exist only transitorily in any place at any time. A "processor," as that term is used herein, is an article of manufacture and/or a machine component configured to execute software and/or firmware instructions in order to perform functions as described in the various embodiments herein. The processor 220 may be a general purpose processor or may be part of an application specific integrated circuit (ASIC). The processor 220 may also be a microprocessor, a microcomputer, a processor chip, a controller, a microcontroller, a digital signal processor (DSP), a state machine, or a programmable logic device. The processor 220 may also be a logical circuit, including a programmable gate array (PGA) such as a field programmable gate array (FPGA), a programmable logic array (PLA), or another type of circuit that includes discrete gate and/or transistor logic. The processor 220 may be a central processing unit (CPU), a graphics processing unit (GPU), or a combination thereof. Additionally, any processor described herein may include multiple processors, parallel processors, a processor with multiple processing cores, or a combination thereof. Multiple processors and/or processing cores may be included in, or coupled to, a single device or multiple devices.

The memory device 250 is one or more memory devices and may include different types of memory devices. A "memory device," as that term is used herein, denotes tangible, storage mediums that can store data and executable instructions, and are non-transitory during the time instructions are stored therein. A "memory device," as that term is used herein, denotes an article of manufacture and/or machine component that is a computer-readable medium from which data and executable instructions can be read by a computer, such as processor 220, for example. A "memory device," as that term is used herein, may be, for example, a random access memory (RAM) device, a read only memory (ROM) device, a flash memory device, an electrically programmable read only memory (EPROM) device, an electrically erasable programmable read-only memory (EEPROM) device, registers, a hard disk, a removable disk, magnetic tape, a compact disk read only memory (CD-ROM) device, a digital versatile disk (DVD), a floppy disk, a blu-ray disk, an optical storage device, or any other form of storage medium known in the art. A "memory device," as that term is used herein, denotes volatile memory devices, non-volatile, secure memory device, unsecure memory devices, encrypted memory devices and/or unencrypted memory devices.

As will be described below in more detail with reference to FIG. 8, the computing system 300 may further include a video display unit, such as, for example, a liquid crystal display (LCD), an organic light emitting diode (OLED), a flat panel display, a solid state display, or a cathode ray tube (CRT), and may include an input device, such as, for example, a keyboard/virtual keyboard or touch-sensitive input screen or speech input with speech recognition, and a cursor control device, such as a mouse or touch-sensitive input screen or pad.

Further, in a representative, non-limited embodiment, methods described herein can be performed by distributed processing, component/object distributed processing, and/or parallel processing. Virtual computer system processing can be constructed to implement one or more of the methods or functionalities described herein, and a processor described herein may be used to support a virtual processing environment.

Figure 3:
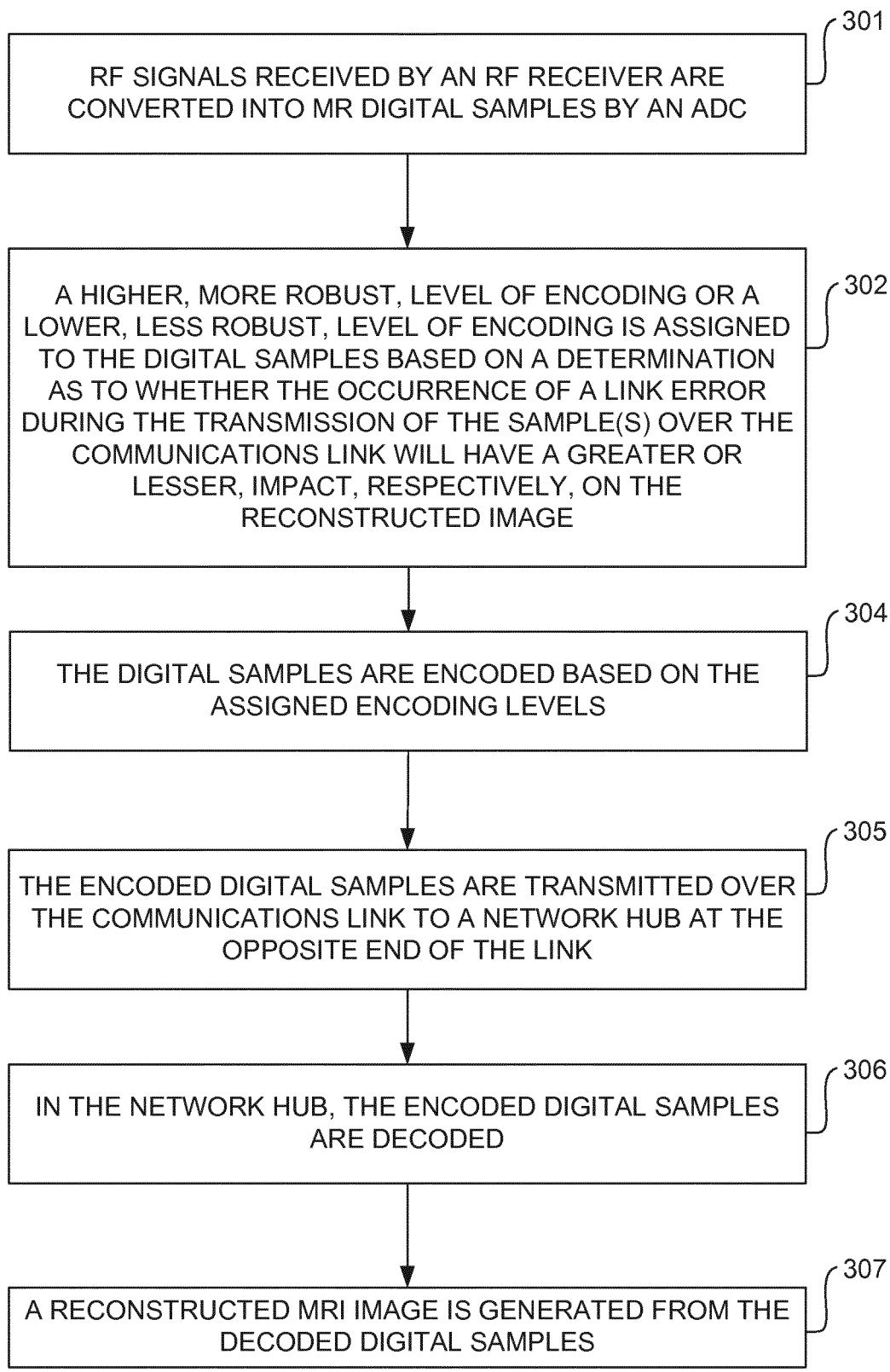
FIG. 3 illustrates a flow diagram of the method in accordance with a representative embodiment for sampling and encoding data before transmitting the data over the data communications link of the MRI system shown in FIG. 1.

FIG. 3 illustrates a flow diagram of the method in accordance with a representative embodiment for sampling and encoding data before transmitting the data over the optical fiber data communications link 150 to the network hub 130. With reference to block 301, RF signals received by an RF receiver are converted into MR digital samples by an ADC. A higher, more robust, level of encoding or a lower, less robust, level of encoding is assigned to the digital samples based on a determination as to whether the occurrence of a communications link error during the transmission of the samples over the communications link will have a greater or lesser impact, respectively, on the final reconstructed MRI image, as indicated by block 302. The samples are encoded based on the levels of encoding that have been assigned to them, as indicated by block 304. The encoded samples are transmitted over the data communications link to the network hub connected to the opposite end of the link, as indicated by block 305. In the network hub, the samples are decoded by a process that reverses the encoding process, as indicated by block 306. A reconstructed MRI image is then generated from decoded samples, as indicated by block 307.

Figure 4:
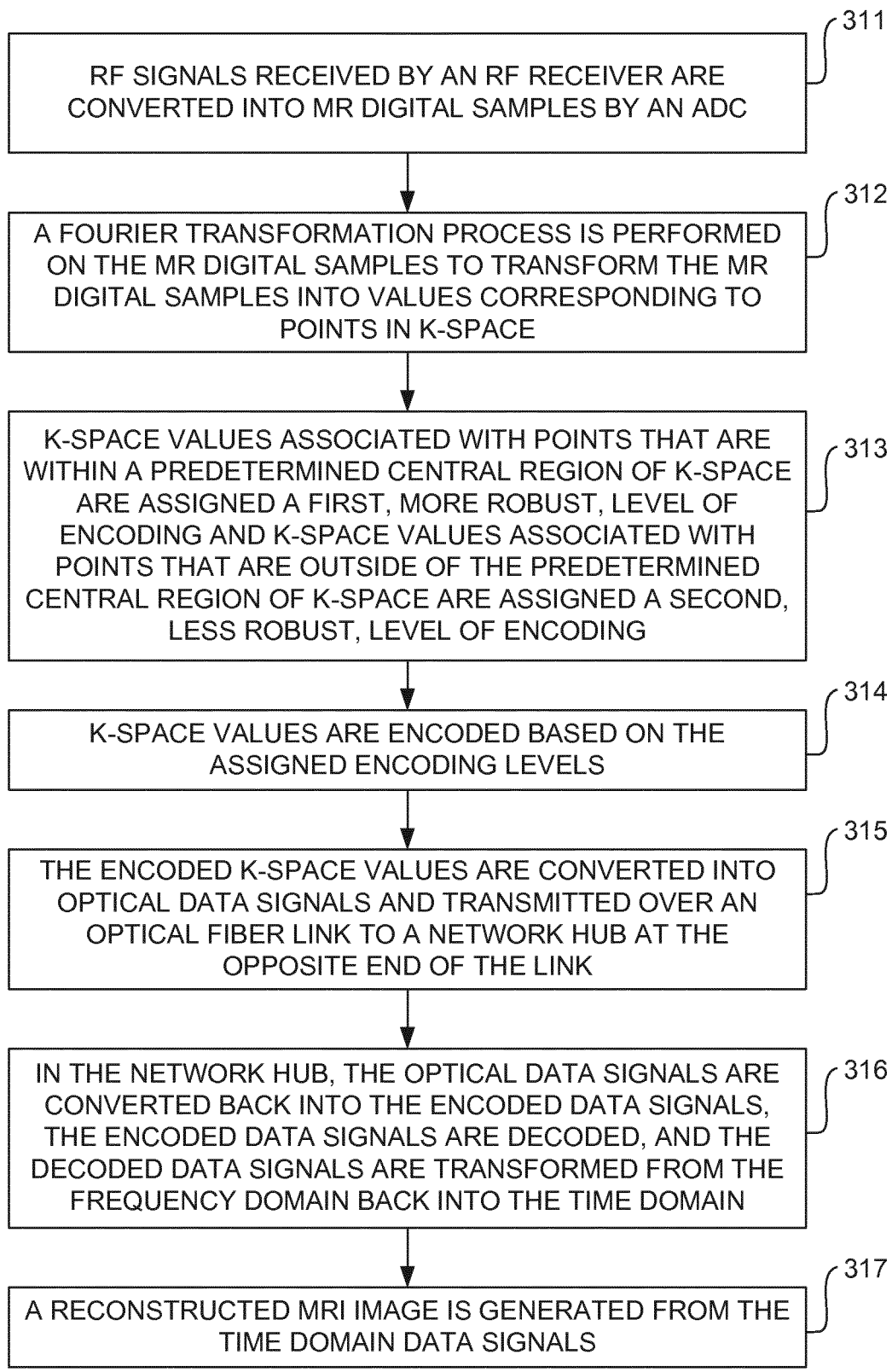
FIG. 4 illustrates a flow diagram of the method in accordance with a representative embodiment for sampling, transforming and encoding data before transmitting the data over the optical fiber data communications link of the MRI system shown in FIG. 1.

FIG. 4 illustrates a flow diagram of the method in accordance with a representative embodiment for sampling, transforming and encoding data before transmitting the data over the optical fiber data communications link 150 to the network hub 130. With reference to block 311, RF signals received by an RF receiver are converted into MR digital samples by an ADC. A Fourier transformation process (e.g., an FFT process) is performed to transform the MR digital samples to values corresponding to points in k-space, as indicated by block 312. K-space values that are within a predefined central region of k-space are assigned a first, higher, or more robust, level of encoding and k-space values that are outside the central region of k-space are assigned a second, lower, less robust, level of encoding, as indicated by block 313.

The k-space values are encoded based on the levels of encoding that have been assigned to them, as indicated by block 314. The encoded k-space values are converted into optical data signals and transmitted over an optical fiber data communications link to a network hub connected to the opposite end of the link, as indicated by block 315. In the network hub, the optical data signals are converted into electrical data signals, decoded by a process that reverses the encoding process and subjected to an inverse FT process to convert the data signals back into time domain data signals, as indicated by block 316. A reconstructed MRI image is then generated from the time domain data signals, as indicated by block 317.

In accordance with the representative embodiment described in connection with FIG. 4, the central region of k-space is predefined by k-space coordinate pairs that define the boundaries of the central region of k-space. Because these boundaries are predefined, the processor 220 easily knows whether k-space values fall within or outside of the central, and therefore assigns encoding levels based on this knowledge. In accordance with another representative embodiment, the processor 220 shown in FIG. 2 does not assign an encoding level based on knowledge of boundaries of the central region of k-space, but analyzes one or more signal characteristics or parameters (e.g., SNR values) associated with points in k-space and assigns encoding levels based on the analyzed signal characteristic(s).

Figure 5:
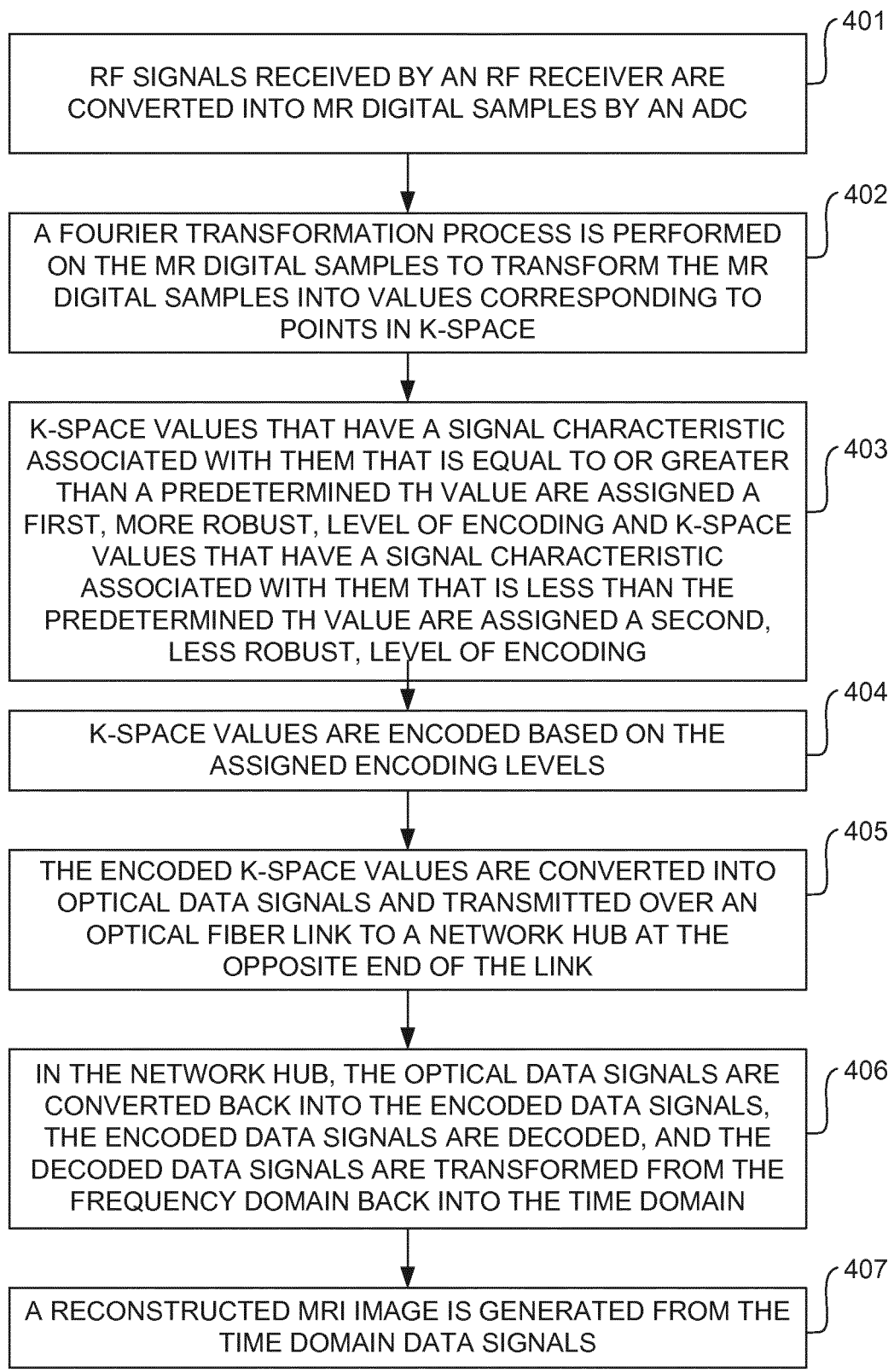
FIG. 5 illustrates a flow diagram of the method in accordance with another representative embodiment in which the level of encoding is assigned and applied based on one or more signal characteristics associated with points in k-space.

FIG. 5 illustrates a flow diagram of the method in accordance with another representative embodiment in which the level of encoding is assigned and applied based on one or more signal characteristics or parameters associated with points in k-space. Points in k-space that are nearer the center of k-space are associated with MR signals that have greater magnitudes and higher SNR values. Conversely, points in k-space that are farther away from the center of k-space are associated with MR signals that have smaller magnitudes and lower SNR values. In accordance with this embodiment, signal characteristics such as SNR values and/or signal amplitudes are used to determine whether a point in k-space is nearer the center of k-space or farther away from the center of k-space.

With reference to block 401 of FIG. 5, RF signals received by an RF receiver are converted into MR digital samples by an ADC. A Fourier transformation process (e.g., an FFT process) is performed to transform the MR digital samples to values corresponding to points in k-space, as indicated by block 402. K-space values that have signal characteristic (e.g., an SNR value and/or an amplitude) associated with them that is equal to or greater than a predetermined threshold (TH) value are assigned a first, higher, or more robust, level of encoding and k-space values that have a signal characteristic (e.g., an SNR value and/or an amplitude) associated with them that is less than the predetermined TH value are assigned a second, lower, less robust, level of encoding, as indicated by block 403.

The k-space values are encoded based on the levels of encoding that have been assigned to them, as indicated by block 404. The encoded k-space values are converted into optical data signals and transmitted over an optical fiber data communications link to a network hub connected to the opposite end of the link, as indicated by block 405. In the network hub, the optical data signals are converted into electrical data signals, decoded by a process that reverses the encoding process and subjected to an inverse FT process to convert the data signals back into time domain data signals, as indicated by block 406. A reconstructed MRI image is then generated from the time domain data signals, as indicated by block 407.

The present disclosure is not limited to evaluating a k-space representation to determine which level of encoding should be assigned and applied. Transformations other than Fourier transformations can be used to exploit the sparsity of the acquired MR signals. Like a Fourier transformation, a wavelet transformation transforms data from time domain data into frequency domain data. However, frequency domain data obtained through wavelet transformation is not represented in k-space. Nevertheless, with respect to MRI data, there are regions in the wavelet-transformed data that have a greater impact than others on the final reconstructed MRI image if a link error occurs during transmission over link 150. Therefore, the methods described above with reference to FIGS. 3 and 4 could be modified for cases where a different type of transformation process is used that exploits the sparsity of the acquired MR signals.

Figure 6:
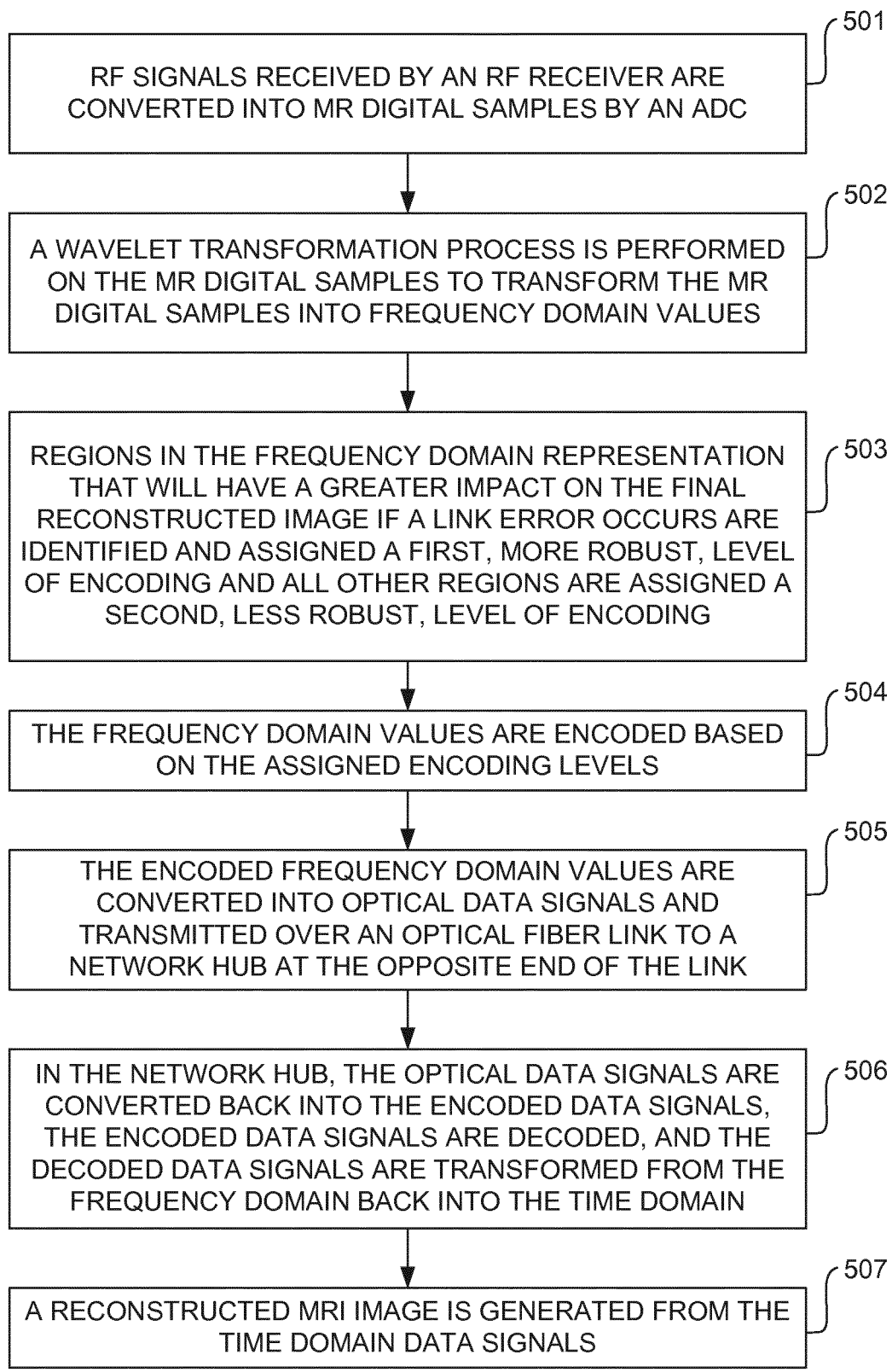
FIG. 6 illustrates a flow diagram that is a modification of the flow diagram shown in FIG. 4 for the case where a wavelet transformation is used instead of a Fourier transformation.

For example, FIG. 6 illustrates a flow diagram that is a modification of the flow diagram of FIG. 4 for the case where a wavelet transformation is used. With reference to block 501, RF signals received by an RF receiver are converted into MR digital samples by an ADC. A wavelet transformation process is performed to transform the MR digital samples in the time domain to a wavelet frequency domain representation, as indicated by block 502. For MRI data, certain regions in the wavelet frequency domain representation will have a greater impact on the image quality of the final reconstructed MRI image if a link error occurs. Those regions are identified and assigned a higher, more robust, level of encoding and all other regions are assigned a lower, less robust, level of encoding, as indicated by block 503.

The frequency domain values are encoded based on the levels of encoding that have been assigned to them, as indicated by block 504. The encoded values are converted into optical data signals and transmitted over an optical fiber data communications link to a network hub connected to the opposite end of the link, as indicated by block 505. In the network hub, the optical data signals are converted into electrical data signals, decoded by a process that reverses the encoding process and subjected to an inverse wavelet transform process to convert the data signals back into time domain data signals, as indicated by block 506. A reconstructed MRI image is then generated from the time domain data signals, as indicated by block 507.

Figure 7:
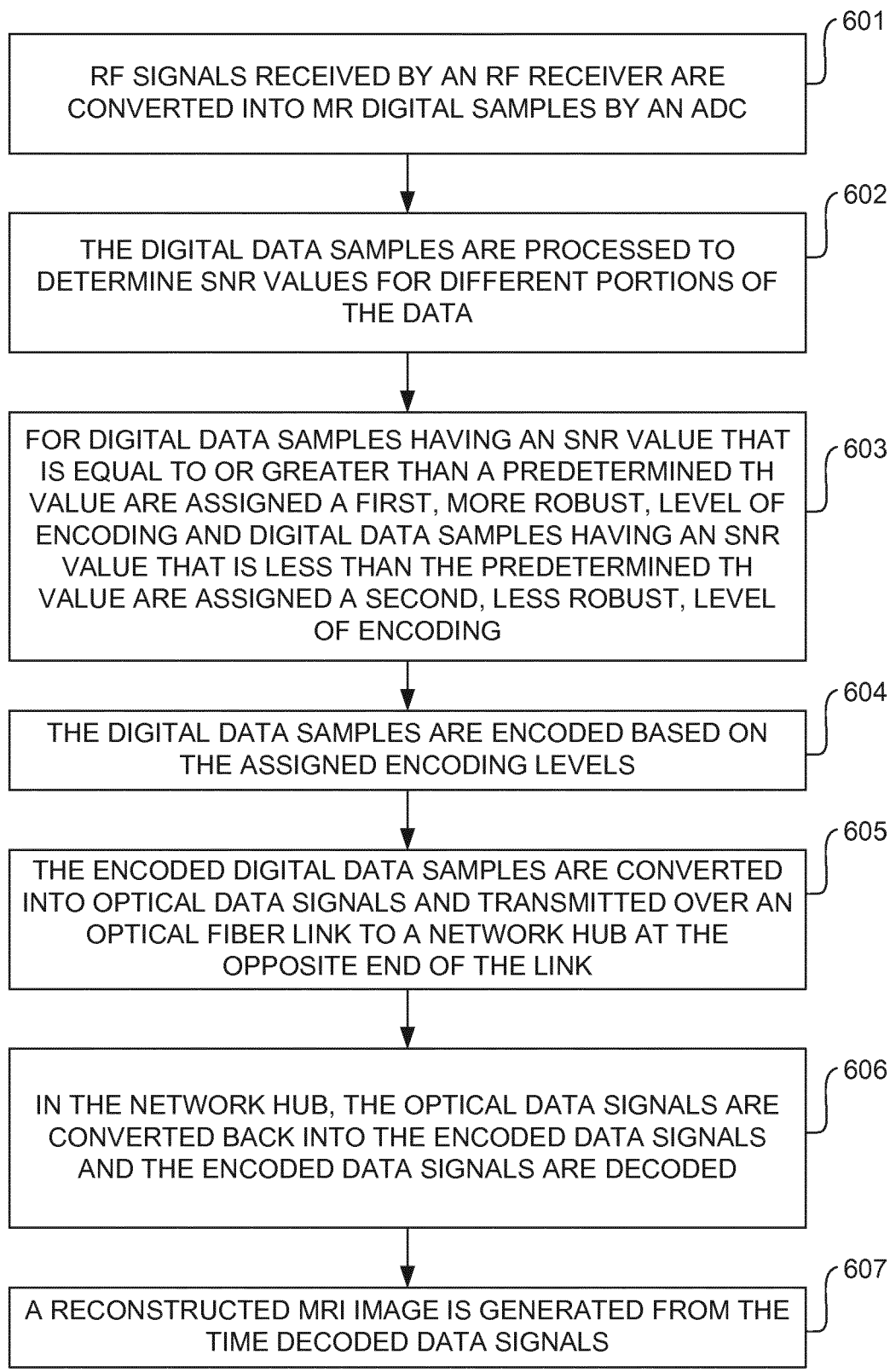
FIG. 7 illustrates a flow diagram that represents the method in accordance with a representative embodiment in which the transformation steps shown in FIGS. 4 through 6 have been eliminated.

FIG. 7 illustrates a flow diagram that represents the encoding method in accordance with a representative embodiment in which the transformation steps described with reference to FIGS. 4 through 6 have been eliminated. With reference to block 601, RF signals received by an RF receiver are converted into MR digital samples by an ADC. The digital data samples are then processed to determine SNR values associated with the digital data samples, as indicated by block 602. With MRI data, data that has a higher SNR will have a greater impact on the image quality of the final reconstructed MRI image if a link error occurs, and vice versa. The digital data samples are assigned a level of encoding based on the SNR associated with those samples. Typically multiple digital data samples will be processed together to determine a single SNR value associated with the samples. Blocks of suitable size can be processed to determine an SNR value associated with each block. Also, SNR values can be determined in ways other than directly from the samples.

Once SNR values have been determined for the different portions of digital data samples, a first, higher, or more robust, level of encoding is assigned to portions of the digital data samples that have an SNR value that is equal to or greater than a predetermined TH value, and a lower, less robust, level of encoding is applied to digital data samples having an SNR value that is less than the predetermined TH value, as indicated by block 603.

The digital data samples are encoded based on the levels of encoding that have been assigned to them, as indicated by block 604. The encoded samples are converted into optical data signals and transmitted over an optical fiber data communications link to a network hub connected to the opposite end of the link, as indicated by block 605. In the network hub, the optical data signals are converted into electrical data signals and decoded by a process that reverses the encoding process, as indicated by block 606. A reconstructed MRI image is then generated from the electrical data signals, as indicated by block 607.

The flow diagram of FIG. 7 could be modified to select the level of encoding based on signal magnitude rather than SNR. With MRI data, an MR signal that has a larger amplitude will typically have a greater impact on the image quality of the final reconstructed MRI image if a link error occurs when the corresponding data is being transmitted over the optical fiber data communications link 150. Conversely, an MR signal that has a smaller amplitude will typically have a lesser impact on the image quality of the final reconstructed MRI image if a link error occurs when the corresponding data is being transmitted over the optical fiber data communications link 150. Blocks 602 and 603 of FIG. 7 could be modified to use signal amplitude rather than SNR to select the level of encoding. For example, at block 602 the MR signal associated with the digital samples would be processed to determine the amplitude of the MR signal. At block 603 the samples would be encoded with a more robust level of encoding if the amplitude is equal to or greater than a predetermined TH value and would be encoded with a less robust level of encoding if the amplitude is less than the predetermined TH value. The steps represented by blocks 604-607 would not change.

Figure 8:
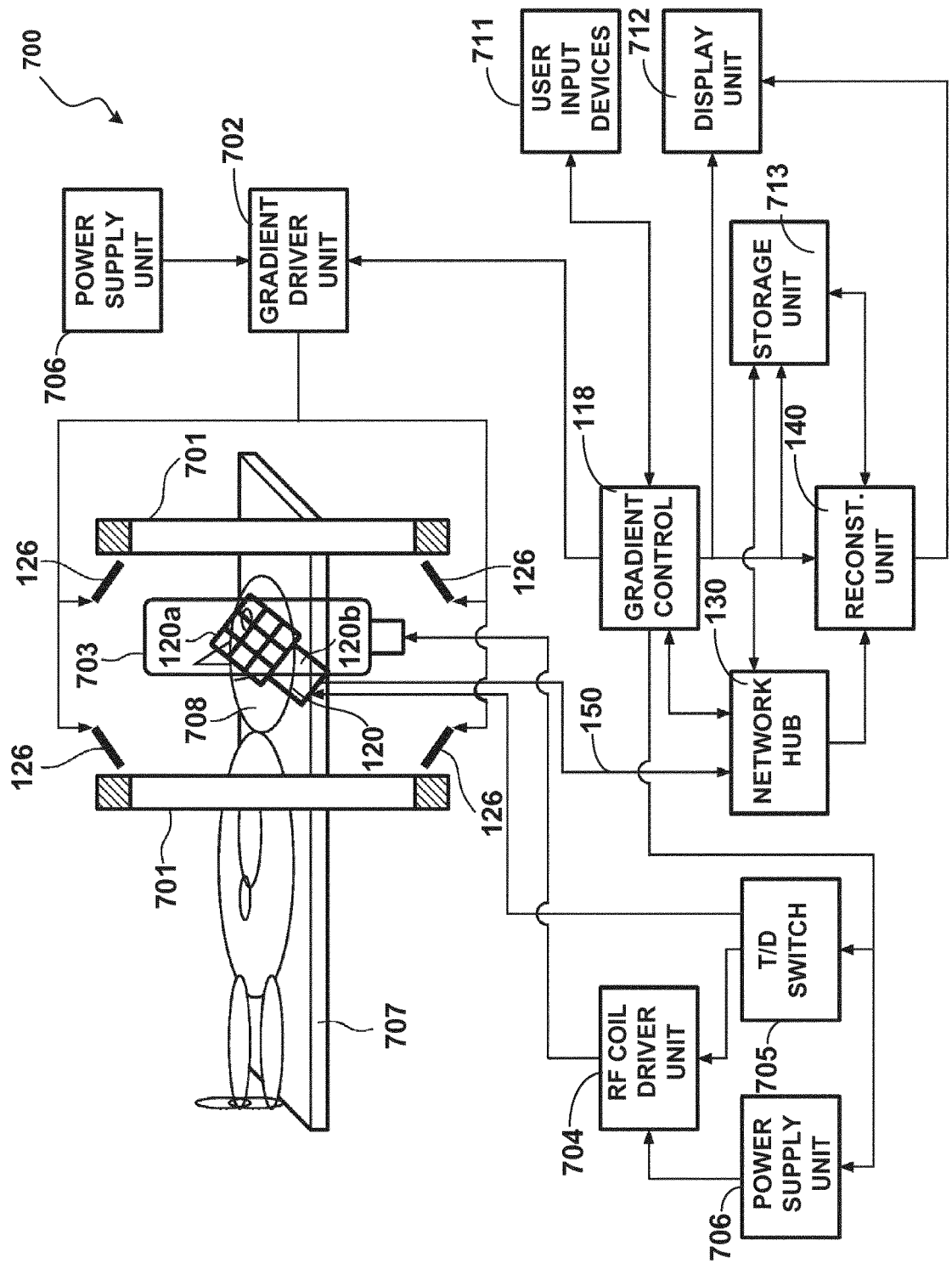
FIG. 8 illustrates a block diagram of the MRI system in accordance with a representative embodiment.

FIG. 8 illustrates a block diagram of an MRI system 700 in accordance with an illustrative embodiment that includes the components described in connection with FIGS. 1 and 2 and additional components not shown in FIGS. 1 and 2. The MRI system 700 comprises a set of main coils 701, multiple gradient coils 126 (FIG. 1) connected to a gradient driver unit 702 comprising gradient amplifier 106 (FIG. 1) and gradient control unit 118 (FIG. 1), and an RF coil system 703 comprising the transmit coil elements 124 (FIG. 1) connected to an RF coil driver unit 704 comprising RF amplifier 108 (FIG. 1) and transmitter control unit 116 (FIG. 1). The function of the RF coil system 703 is further controlled by a transmit/detune (T/D) switch 705. The receive coil elements with integrated digitizer 120 shown in FIG. 1 comprises receive coil elements 120a and RF receiver 120b shown in FIG. 7. The RF receiver 120b comprises the sampling and encoding circuit 200 shown in FIG. 2. Although a single RF receiver 120b is shown in FIG. 8, the MRI system 700 may include N RF receivers 120b, where N is a positive integer that is greater than or equal to one.

The receive coil elements 120a acquire MR signals from at least a portion of a region excited by the transmit coil elements 124 (FIG. 1) of the RF coil system 703. The acquired MR signals are processed by the sampling and encoding circuit 200 (FIG. 2) of the receive coil elements with integrated digitizer 120. The processed MR signals are transferred as optical signals from the optical transmitter 240 (FIG. 2) of the RF receiver 120b to the network hub 130 (FIG. 1) via the optical fiber data communications link 150. The gradient coils 126 and the transmit coil elements 124 are powered by a power supply unit 706. A transport system 707, such as, for example, a patient table, is used to position a subject 708, such as, for example, a patient, within the MRI system 700. The control and data acquisition system 110 controls the operations of the reconstruction unit 140 for reconstructing the final MRI image, a display unit 712 such as a monitor screen or a projector, for example, for displaying the reconstructed image, a storage unit 713 for storing data and computer instructions, and a user input device 711, such as, for example, a keyboard, a mouse, a trackball, etc.

The main coils 701 generate a steady and uniform static magnetic field. The main coils 701 are arranged in such a way that they typically enclose a tunnel-shaped examination space (not shown), into which the subject 708 may be introduced. Another common configuration comprises opposing pole faces with an air gap in between them into which the subject 708 may be introduced by using the transport system 707. To enable MR imaging, temporally variable magnetic field gradients superimposed on the static magnetic field are generated by the multiple gradient coils 126 in response to currents supplied by the gradient driver unit 702. The power supply unit 706 supplies currents to the multiple gradient coils 126, as a result of which gradient pulses (also called gradient pulse waveforms) are generated.

The gradient control unit 118 of the control and data acquisition system 110 controls the characteristics of the currents, notably their strength, duration and direction, flowing through the gradient coils 126 to create the appropriate gradient waveforms. The transmit coil elements 124 (FIG. 1) of the RF coil system 703 generate RF excitation pulses in the subject 708, while the receive coil elements 120a receive MR signals generated by the subject 708 in response to the RF excitation pulses. The RF coil driver unit 704 supplies current to the transmit coil elements 124 of the RF coil system 703 to transmit the RF excitation pulses.

The characteristics of the transmitted RF excitation pulses, notably their strength and duration, are controlled by the control and data acquisition system 110. The transmit coil elements 124 (FIG. 1) of the RF coil system 703 are typically operated in one of two modes, namely transmit and detune modes, by the control and data acquisition system 110 via the T/D switch 705. The T/D switch 705 is provided with electronic circuitry that switches the transmit coil elements 124 between the two modes and prevents the transmit coil elements 124 from coupling noise during signal acquisition by the receive coil elements 120a. The T/D switch 705 also switches the receive coil elements 120a between two modes during operation, namely between receive mode and detune or decoupling mode. The receive coil elements 120a are switched to decoupling mode during the transmit mode of the transmit coil elements 124 and to receive mode during the decoupling mode of the transmit coil elements 124. The switching between the two modes of both the transmit coil elements 124 and the receive coil elements 120a is coordinated by the control and data acquisition system 110, typically under control of software and/or firmware being executed by one or more processors of the control and data acquisition system 110.

User input interface devices 711 such as a keyboard, mouse, touch-sensitive screen, a trackball, etc., enable an operator to interact with the MRI system 700. The optical data signals received in the network hub 130 contain the actual information concerning the local spin densities in a region of interest of the subject 708 being imaged. The received signals are converted from the optical domain to the electrical domain and decoded. The decoded signals are reconstructed by the reconstruction unit 140 and displayed on the display unit 712 as an MRI image. It is possible to store the signal from the reconstruction unit 140 in a storage unit 713 for further processing at a later time.

It should be noted that while the representative embodiments described herein refer to the data communications link 150 being an optical fiber data communications link, the link could instead be a wired or wireless data communications link. In the latter cases, there would be no need to convert the digital data signals from the electrical domain to the optical domain, and vice versa. However, if a wired or wireless communication link is used for this purpose, other precautions may need to be taken to ensure that the magnetic fields of the MRI system 700 do not create link errors or to minimize link errors.

It should be noted that although the illustrative embodiments have been described with reference to a few illustrative embodiments for the purpose of demonstrating the principles and concepts of the present teachings. Persons of skill in the art will understand how the principles and concepts of the present teachings can be applied to other embodiments not explicitly described herein. It should also be noted that the circuits and methods described above with reference to FIGS. 1-8 are merely examples of suitable configurations and methods that demonstrate the inventive principles and concepts. As will be understood by those skilled in the art in view of the description being provided herein, many modifications may be made to the embodiments described herein while still achieving the goals of the present teachings, and all such modifications are within the scope of the invention.

What is claimed is:

1. A data acquisition system for use in a magnetic resonance imaging (MRI) system, the data acquisition system comprising:
   a first radio frequency (RF) receiver configured to receive a first set of RF signals detected by at least a first RF coil of the MRI system, the first set of RF signals being analog signals representative of image data;
   a first analog-to-digital converter (ADC) configured to convert the first set of the RF signals into a first set of digital magnetic resonance (MR) signals;

a first processor configured to perform an encoding algorithm including:
  transforming the first set of digital MR signals to k-pace values at respective points in k-space defined by coordinate pairs; and
  encoding the k-space values with a higher, more robust, level of encoding or with a lower, less robust, level of encoding based on a determination by the first processor as to whether an occurrence of a communications link error during a transmission of the k-space values at the respective points in k-space over a first communications link will have a greater or lesser impact, respectively, on a reconstructed MRI image to be reconstructed using the k-space values; and
a first transmitter configured to transmit the encoded k-space values over the first communications link to a computer of the MRI system that reconstructs the MRI image from the encoded k-space values.

2. The data acquisition system of claim 1, wherein the first processor performs the encoding algorithm by:
  analyzing the k-space values to determine at least a first signal characteristic associated with the respective k-space values at the respective points in k-space; and
  selecting the higher, more robust, level of encoding to be used to encode the k-space values if the first signal characteristic is equal to or greater than a first predetermined threshold (TH) value and selecting the lower, less robust, level of encoding to be used to encode the k-space values if the first signal characteristic is below the first predetermined TH value.

3. The data acquisition system of claim 2, wherein said at least a first signal characteristic is a signal amplitude associated with the k-space values at the respective points in k-space.

4. The data acquisition system of claim 2, wherein said at least a first signal characteristic is a signal-to-noise ratio (SNR) associated with the k-space values at the respective points in k-space.

5. The data acquisition system of claim 4, wherein the encoding includes encoding the k-space values with a higher, more robust, level of encoding for k-space values in a central region of k-space and with a lower, less robust, level of encoding for k-space values outside the central region of k-space.

6. The data acquisition system of claim 1, wherein the first RF receiver is disposed on the first coil.

7. The data acquisition system of claim 1, wherein the first RF receiver is further configured to receive RF signals detected by at least a second RF coil of the MRI system, the RF signals detected by the second RF coil being analog signals representative of image data, the first ADC converting the RF signals detected by the second RF coil into a second set of digital MR signals, the first processor performing the encoding algorithm further by:
  transforming the second set of digital MR signals to second k-space values at respective points in k-space defined by coordinate pairs, and
  encoding the second k-space values with the higher, more robust, level of encoding or with the lower, less robust, level of encoding based on a determination by the first processor as to whether an occurrence of a communications link error during a transmission of the second k-space values at the respective points in k-space over the first communications link will have a greater or lesser impact, respectively, on the reconstructed MRI image to be reconstructed using the k-space values and the second k-space values.

8. The data acquisition system of claim 4, further comprising:
  a second radio frequency (RF) receiver configured to receive a second set of RF signals detected by a second coil of the MRI system, the second set of RF signals received by the second RF receiver being analog signals representative of image data;
  a second ADC configured to convert the second set of RF signals received by the second RF receiver into a second set of digital MR signals;
  a second processor configured to perform said encoding algorithm including:
    transforming the second set of digital MR signals to second k-space values at respective points in k-space defined by coordinate pairs, and
    encoding the second k-space values with the higher, more robust, level of encoding or with the lower, less robust, level of encoding based on a determination by the second processor as to whether an occurrence of a communications link error during a transmission of the second k-space values at the respective points in k-space over a second communications link will have a greater or lesser impact, respectively, on a reconstructed MRI image to be reconstructed using the second k-space values.

9. The data acquisition system of claim 8, wherein the first and second transmitters include serialization logic configured to convert the encoded k-space values and second k-space values into respective serial data streams and to cause the respective data streams to be transmitted serially over the first and second communications links to the computer of the MRI system that performs image reconstruction.

10. A data acquisition system for use in a magnetic resonance imaging (MRI) system, the data acquisition system comprising:
  N radio frequency (RF) receivers of the MRI system, where N is a positive integer that is greater than or equal to 1, the N RF receivers being configured to receive N sets of RF signals detected by N RF coils, respectively, the N sets of RF signals being analog signals representative of N sets of image data, respectively;
  P analog-to-digital converters (ADCs) configured to convert the received N sets of RF signals, respectively, into N sets of digital signals, respectively, and to output the N sets of digital signals, respectively, where P is a positive integer that is greater than or equal to 1;
  at least one processor configured to perform an encoding algorithm that encodes the each set of the N sets of digital MR signals with a larger number of parity bits or with a smaller number of bits based on a determination by the first processor as to whether an occurrence of a communications link error during a transmission of the respective set of the N sets of the digital MR signals over the communications link will have a greater or lesser impact, respectively, on a reconstructed MRI image to be reconstructed using the respective set of the N sets of the digital MR signals; and
  M transmitters configured to transmit the respective encoded digital MR signal sets over M communications links, respectively, to a computer of the MRI system that performs image reconstruction, where M is a positive integer that is greater than or equal to 1.

11. The data acquisition system of claim 10, wherein the at least one processor comprises N processors, each processor being configured to perform the encoding algorithm on a respective one of the N digital MR signal sets.

12. The data acquisition system of claim 11, wherein M equals N.

13. The data acquisition system of claim 11, wherein M and N are unequal.

14. The data acquisition system of claim 10, wherein prior to analyzing the N sets of digital MR signals, the processor performs a transformation on the N sets of digital signals to enhance a sparsity of the N sets of digital signals, and wherein the first processor makes the determination as to whether an occurrence of a communications link error during a transmission of the respective set of the N sets of the digital MR signals over the communications link will have a greater or lesser impact, respectively, on a reconstructed MRI image by analyzing the transformed N sets of digital signals to determine whether N respective signal-to-noise ratios (SNRs) associated with the respective sets of digital MR signals are less than a predetermined threshold (TH) value or are greater than or equal to the predetermined threshold value, wherein if a determination is made that the any of the N SNRs is less than the predetermined TH value, the larger number of parity bits is selected for use in encoding the respective set of the N sets of the digital signals, and wherein if a determination is made that any of the SNRs is greater than or equal to the predetermined TH value, the smaller number of bits is selected for use in encoding the respective set of the N sets of the digital signals.

15. The data acquisition system of claim 10, wherein prior to analyzing the N sets of digital signals, the processor performs a transformation during which the N sets of digital signals are transformed from a time domain representation to a frequency domain representation, and wherein the first processor makes the determination as to whether an occurrence of a communications link error during a transmission of the respective set of the N sets of the digital MR signals over the communications link will have a greater or lesser impact, respectively, on a reconstructed MRI image by analyzing the transformed N sets of digital signals to determine whether N respective signal-to-noise ratios (SNRs) associated with the respective sets of digital MR signals are less than a predetermined threshold (TH) value or are greater than or equal to the predetermined threshold value, wherein if a determination is made that the any of the N SNRs is less than the predetermined TH value, the larger number of parity bits is selected for use in encoding the respective set of the N sets of the digital signals, and wherein if a determination is made that any of the SNRs is greater than or equal to the predetermined TH value, the smaller number of bits is selected for use in encoding the respective set of the N sets of the digital signals.

16. The data acquisition system of claim 10, wherein prior to analyzing the N sets of digital signals, the processor performs a transformation during which the N sets of digital signals are transformed from a time domain representation to a spatial frequency domain representation in k-space, and wherein the first processor makes the determination as to whether an occurrence of a communications link error during a transmission of the respective set of the N sets of the digital MR signals over the communications link will have a greater or lesser impact, respectively, on a reconstructed MRI image by analyzing the k-space representation to determine whether N respective signal-to-noise ratios (SNRs) associated with the respective sets of digital MR signals are less than a predetermined threshold (TH) value or are greater than or equal to the predetermined threshold value, wherein if a determination is made that the any of the N SNRs is less than the predetermined TH value, the larger number of parity bits is selected for use in encoding the respective set of the N sets of the digital signals, and wherein if a determination is made that any of the SNRs is greater than or equal to the predetermined TH value, the smaller number of bits is selected for use in encoding the respective set of the N sets of the digital signals.

17. The data acquisition system of claim 10, wherein the N RF receivers are disposed on the N RF coils, respectively.

18. A data acquisition system for use in a magnetic resonance imaging (MRI) system, the data acquisition system comprising:
  a first radio frequency (RF) receiver configured to receive RF signals detected by at least a first RF coil of the MRI system, the RF signals being analog signals representative of image data;
  a first analog-to-digital converter (ADC) configured to convert the received RF signals into a first set of digital signals and to output the first set of digital signals;
  a first processor configured to perform an encoding algorithm, wherein the processor performs the encoding algorithm by:
    analyzing the first set of digital signals to determine a first signal-to-noise ratio (SNR) associated with the first set of digital signals;
    selecting a larger number of parity bits to be used to encode digital MR signals of the first set if the first SNR is equal to or greater than a first predetermined threshold (TH) value;
    selecting a smaller number of bits to be used to encode the digital MR signals of the first set if the first SNR is less than the first predetermined TH value; and
    encoding the first set of digital MR signals with the selected level of encoding to generate encoded digital MR signals; and
  a first transmitter configured to transmit the encoded digital MR signals over a first communications link to a computer of the MRI system that performs image reconstruction.

19. A method for use in a magnetic resonance imaging (MRI) system for encoding data to be transmitted over a communications link, the method comprising:
  receiving radio frequency (RF) signals detected by at least a first RF coil of the MRI system, the RF signals being analog signals representative of image data;
  converting a first set of the received RF signals into a first set of digital magnetic resonance (MR) signals, wherein the first set of digital MR signals are k-space values;
  encoding the first set of digital MR signals with a larger number of bits or with a smaller number of bits such that the k-space values in a central region of k-space are encoded with the smaller number of bits and k-space values outside the central region of k-space are encoded with the larger number of bits based on a determination as to whether an occurrence of a communications link error during a transmission of the first set of digital MR signals over a communications link will have a greater or lesser impact, respectively, on an MRI image to be reconstructed using the first set of digital MR signals to generate encoded digital MR signals; and
  transmitting the encoded digital signals over the communications link to a computer of the MRI system that reconstructs the MRI image from the first set of digital MR signals.

20. A computer program for use in a magnetic resonance imaging (MRI) system for adjusting a level of encoding to be performed on a first set of digital magnetic resonance (MR) signals corresponding to image data acquired by one or more radio frequency (RF) coils of the MRI system, wherein the first set of digital MR signals are k-space values, the computer program comprising computer instructions for execution by a processor of the data acquisition system, the computer instructions being stored on a non-transitory computer-readable medium, the computer instructions comprising:

an encoding algorithm that encodes the first set of digital MR signals with a larger number of bits or with a smaller number of bits such that the k-space values in a central region of k-space are encoded with the smaller number of bits and k-space values outside the central region of k-space center are encoded with the larger number of bits.

21. The computer program of claim 20, wherein the encoding algorithm makes the determination as to whether to encode the first set of digital MR signals with the larger number of bits or the smaller number of bits by analyzing the first set of the digital MR signals to determine whether a signal-to-noise ratio (SNR) associated with the first set of digital MR signals is greater than, equal to or less that a predetermined threshold (TH) value.

22. The computer program of claim 21, if the encoding algorithm determines that the SNR is equal to or greater than the predetermined TH value, the encoding algorithm encodes the first set of digital MR signals with the larger number of bits, and wherein if the encoding algorithm determines that the SNR is less than the predetermined TH value, the encoding algorithm encodes the first set of digital MR signals with the smaller number of bits.

* * * * *